United States Patent
Kim et al.

(10) Patent No.: US 6,524,884 B1
(45) Date of Patent: Feb. 25, 2003

(54) METHOD FOR FABRICATING AN ORGANIC ELECTROLUMINESCENE DEVICE HAVING ORGANIC FIELD EFFECT TRANSISTOR AND ORGANIC ELOECTROLUMINESCENCE DIODE

(75) Inventors: Seong-hyun Kim, Daejon (KR); Lee-mi Do, Daejon (KR); Hye-yong Chu, Daejon (KR); Jeong-ik Lee, Suwon (KR); Hyo-young Lee, Daejon (KR); Ji-young Oh, Daejon (KR); Yong-suk Yang, Daejon (KR); Tae-hyoung Zyung, Daejon (KR)

(73) Assignee: Korea Electronics and Telecommunications Research Institute (KR)

( * ) Notice: Subject to any disclaimer, the term of this patent is extended or adjusted under 35 U.S.C. 154(b) by 0 days.

(21) Appl. No.: 10/150,368

(22) Filed: May 16, 2002

Related U.S. Application Data

(62) Division of application No. 10/052,651, filed on Jan. 18, 2002.

(30) Foreign Application Priority Data

Aug. 22, 2001 (KR) ............................................. 01-50744

(51) Int. Cl.$^7$ ................................................ H01L 51/40
(52) U.S. Cl. ............................. 438/99; 438/21; 438/29; 438/608; 438/609; 257/40
(58) Field of Search ............................. 438/99, 21, 29, 438/608, 609; 257/40, 114, 292, 99, 79, 103

(56) References Cited

U.S. PATENT DOCUMENTS

| | | | |
|---|---|---|---|
| 5,384,517 A | * | 1/1995 | Uno .............................. 257/13 |
| 5,929,474 A | | 7/1999 | Huang et al. ................ 257/292 |
| 5,953,587 A | * | 9/1999 | Forrest et al. ................. 257/40 |
| 5,981,306 A | * | 11/1999 | Burrows et al. ............... 257/40 |
| 6,384,529 B2 | * | 5/2002 | Tang et al. .................. 313/504 |

FOREIGN PATENT DOCUMENTS

| | | | |
|---|---|---|---|
| KR | 1998-083500 | 5/1998 | ............. H01S/3/00 |
| KR | 1999-0088592 | 12/1999 | ......... H01L/29/786 |

* cited by examiner

*Primary Examiner*—John F. Niebling
*Assistant Examiner*—Angel Roman
(74) *Attorney, Agent, or Firm*—Blakely Sokoloff Taylor & Zafman

(57) ABSTRACT

Provided is an organic electroluminescent (EL) device including a substrate, a transparent electrode formed on the substrate, an organic light-emitting layer formed on the transparent electrode, a metal electrode formed on the organic light-emitting layer, a first insulating layer formed on the metal electrode, a gate electrode formed on the first insulating layer, a second insulating layer formed on the gate electrode, an organic semiconducting layer formed on the second insulating layer, a source electrode connected to one end of the organic semiconducting layer on the second insulating layer and connected to the metal electrode, and a drain electrode connected to the other end of the organic semiconducting layer on the second insulating layer.

8 Claims, 5 Drawing Sheets

PRIOR ART

METHOD FOR FABRICATING AN ORGANIC ELECTROLUMINESCENE DEVICE HAVING ORGANIC FIELD EFFECT TRANSISTOR AND ORGANIC ELOECTROLUMINESCENCE DIODE

This is a divisional application of Ser. No. 10/052,651 filed Jan. 18, 2002, the benefit of which is claimed under 35 USC 120.

BACKGROUND OF THE INVENTION

1. Field of the Invention

The present invention relates to an organic electroluminescent (EL) device and a method for fabricating the same, and more particularly, to an organic EL device having an organic field effect transistor and an organic light-emitting diode incorporated therein, and a method for fabricating the same.

2. Description of the Related Art

Organic electroluminescent (EL) devices radiate light by electrical excitation generated by an externally applied electrical field. Among such organic EL devices, organic light-emitting diodes (LEDs) are expected to be widely used for flat-panel display purposes. This is because the organic LED can be fabricated with simplicity, at room temperature, and it can be fabricated over not only a crystalline substrate but also a bendable plastic or glass substrate. The organic LED can be formed over both a crystalline substrate or non-crystalline (amorphous) substrate. However, since transistors for driving organic LEDs are processed at high temperature, it is not easy to fabricate the organic LED over a plastic substrate. Thus, in order to drive an organic LED formed over a plastic substrate, there is a trend to use an organic field effect transistor (FET) that can be processed at low temperature of 100° C. or less.

FIG. 1 is a cross-sectional view showing an example of a conventional organic EL device having an organic FET and an organic LED incorporated therein.

Referring to FIG. 1, the conventional organic EL device includes an organic LED 110 and an organic FET 120 incorporated on a single substrate 100.

The organic LED 110 includes a transparent electrode 111, an organic light-emitting layer 112 and a metal electrode 113 sequentially formed on the substrate 100. The organic FET 120 includes a gate electrode 121 formed on the substrate 100, a dielectric layer 122 formed on the gate electrode 121, an organic semiconducting layer 123 formed on the dielectric layer 122 and a source electrode 124 and a drain electrode 125 formed on the dielectric layer 122 at either side of the organic semiconducting layer 123. The drain electrode 125 is connected to the transparent electrode 111 and organic light-emitting layer 112 of the organic LED 110.

The organic EL device operates as follows. An electric field is applied to the organic semiconducting layer 123 by the gate electrode 121 of the organic FET 120. A channel is formed in the organic semiconducting layer 123 between the source electrode 124 and the drain electrode 125 by the applied electric field. Carriers move from the source electrode 124 to the drain electrode 125 through the channel to be injected into the organic light-emitting layer 112 of the organic LED 110. The carriers injected into the organic light-emitting layer 112 are combined to generate excitons. The generated excitons extinguish while emitting light corresponding to a lattice energy gap.

The organic LED 110 is parallel to the organic FET 120 in a horizontal direction, and, due to the positional relationship therebetween, the size of the organic FET 120 undesirably reduces an aperture ratio. In order to overcome the problem of a smaller aperture ratio, it is necessary to increase the light emission intensity of a unit pixel in a display device, which deteriorates a life characteristic of the display device.

SUMMARY OF THE INVENTION

To solve the above-described problems, it is an object of the present invention to provide an organic electroluminescent device having an organic field effect transistor and an organic light-emitting diode incorporated therein while having a high aperture ratio.

It is another object of the present invention to provide a method.for fabricating the organic electroluminescent device.

To accomplish the first object of the present invention, there is provided a an organic electroluminescent (EL) device including a substrate, a transparent electrode formed on the substrate, an organic light-emitting layer formed on the transparent electrode, a metal electrode formed on the organic light-emitting layer, a first insulating layer formed on the metal electrode, a gate electrode formed on the first insulating layer, a second insulating layer formed on the gate electrode, an organic semiconducting layer formed on the second insulating layer, a source electrode connected to one end of the organic semiconducting layer on the second insulating layer and connected to the metal electrode, and a drain electrode connected to the other end of the organic semiconducting layer on the second insulating layer.

The substrate is preferably a plastic, glass or crystalline substrate.

The transparent electrode may include indium tin oxide (ITO), indium zinc oxide (IZO) and aluminum zinc oxide (AZO).

The organic light-emitting layer may include an organic monomolecular component or an organic polymeric component.

The metal electrode may include at least one selected from the group consisting of aluminum (Al), magnesium (Mg), calcium (Ca), barium (Ba), lithium (Li), yttrium (Y), ytterbium (Yb), cesium (Cs) and silver (Ag).

The dielectric constant of the first insulating layer is preferably relatively lower than that of the second insulating layer.

The gate electrode may include at least one selected from the group consisting of gold (Ag), palladium (Pd), silver (Ag), platinum (Pt), aluminum (Al), copper (Cu) and titanium (Ti).

The source electrode and the drain electrode may include at least one selected from the group consisting of titanium (Ti), gold (Ag), palladium (Pd), chrome (Cr), platinum (Pt), aluminum (Al), calcium (Ca), barium (Ba), magnesium (Mg), silver (Ag), strontium (Sr) and lithium (Li).

The organic semiconducting layer is preferably either an n-type or a p-type.

According to another aspect of the present invention, there is provided an organic EL device including a metal substrate having a first, bottom surface and a second, top surface, an organic light-emitting layer formed on the first surface of the metal substrate, a transparent electrode formed on the organic light-emitting layer, a first insulating layer formed on the second surface of the metal substrate, a gate electrode formed on the first insulating layer, a second insulating layer formed on the gate electrode, an organic semiconducting layer formed on the second insulating layer, a source electrode connected to one end of the organic semiconducting layer on the second insulating layer and connected to the second surface of the metal substrate, and a drain electrode connected to the other end of the organic semiconducting layer on the second insulating layer.

The metal substrate is preferably formed of aluminum or stainless steel coated with one selected from the group consisting of Al, Ca, Sr, Y, Yb, Li and Mg.

According to still another aspect of the present invention, there is provided an organic EL device including an insulating substrate having a first, bottom surface and a second, top surface, a metal electrode formed on the first surface of the insulating substrate, an organic light-emitting layer formed on the metal electrode, a transparent electrode formed on the organic light-emitting layer, a gate electrode formed on the second surface of the insulating substrate, an insulating layer formed on the gate electrode, an organic semiconducting layer formed on the insulating layer, a source electrode connected to one end of the organic semiconducting layer on the insulating layer and connected to the metal substrate, and a drain electrode connected to the other end of the organic semiconducting layer on the insulating layer.

The insulating substrate is preferably a glass or plastic substrate.

To accomplish the second object of the present invention, there is provided a method for fabricating an organic EL device including the steps of sequentially forming a transparent electrode, an organic light-emitting layer and a metal electrode over a substrate to forming an organic LED, forming a first insulating layer on the metal electrode, forming a gate electrode patterned on a portion of the surface of the first insulating layer, forming a second insulating layer on the first insulating layer and the gate electrode, sequentially patterning the second insulating layer and the first insulating layer to form a via hole partially exposing the surface of the metal electrode, forming a metal electrode layer filling the via hole and covering the second insulating layer, patterning the metal electrode layer to partially expose the surface of the second insulating layer, and forming a source electrode contacting the metal electrode and a drain on the second insulating layer, and forming an organic semiconducting layer on the second insulating layer between the source electrode and the drain electrode.

The organic light-emitting layer is preferably formed of an organic monomolecular material or an organic polymeric material.

Also, the organic light-emitting layer is preferably formed by thermal evaporation, spin coating, pulsed laser deposition, cluster ion beam deposition or sputtering.

The metal electrode is preferably formed by thermal evaporation, spin coating, pulsed laser deposition, cluster ion beam deposition or sputtering.

According to another aspect of the present invention, there is provided a method for fabricating an organic EL device including the steps of providing a metal substrate having a first, bottom surface and a second, top surface, sequentially forming an organic light-emitting layer and a transparent electrode on the first surface of the metal substrate, forming a first insulating layer on the second surface of the metal substrate, forming a gate electrode patterned on a portion of the surface of the first insulating layer, forming a second insulating layer on the first insulating layer and the gate electrode, sequentially patterning the second insulating layer and the first insulating layer to form a via hole partially exposing the surface of the metal substrate, forming a metal electrode layer filling the via hole and covering the second insulating layer, patterning the metal electrode layer to partially expose the surface of the second insulating layer, and forming a source electrode contacting the metal electrode and a drain on the second insulating layer, and forming an organic semiconducting layer on the second insulating layer between the source electrode and the drain electrode.

In step of providing the metal substrate, aluminum or stainless steel coated with one selected from the group consisting of Al, Ca, Sr, Y, Yb, Li and Mg, is preferably used.

According to still another aspect of the present invention, there is provided a method for fabricating an organic EL device including the steps of providing an insulating layer having a first, bottom surface and a second, top surface, sequentially forming a metal electrode, an organic light-emitting layer and a transparent electrode on the first surface of the insulating substrate, forming a gate electrode patterned on a portion of the surface of the insulating layer so as not to cover the via hole, forming an insulating layer on the insulating substrate and the gate electrode, patterning the second insulating layer to expose the via hole of the insulating substrate, forming a metal electrode layer contacting the via hole and covering the insulating layer, patterning the metal electrode layer to partially expose the surface of the insulating layer, and forming a source electrode contacting the metal electrode and a drain on the second insulating layer, and forming an organic semiconducting layer on the insulating layer between the source electrode and the drain electrode.

In step of providing the insulating layer, a glass or plastic substrate having a via hole is preferably used.

The present invention is characteristic in that the organic LED and the organic FET for driving the same are vertically incorporated. Thus, the aperture ratio can be noticeably improves, reducing the luminous area, thereby increasing the life cycle of the device.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

The present invention will now be described more fully hereinafter with reference to the accompanying drawings, in which a preferred embodiment of the invention is shown. The present invention may, however, be embodied in different forms and should not be construed as limited to the embodiment set forth herein.

Figure 1:
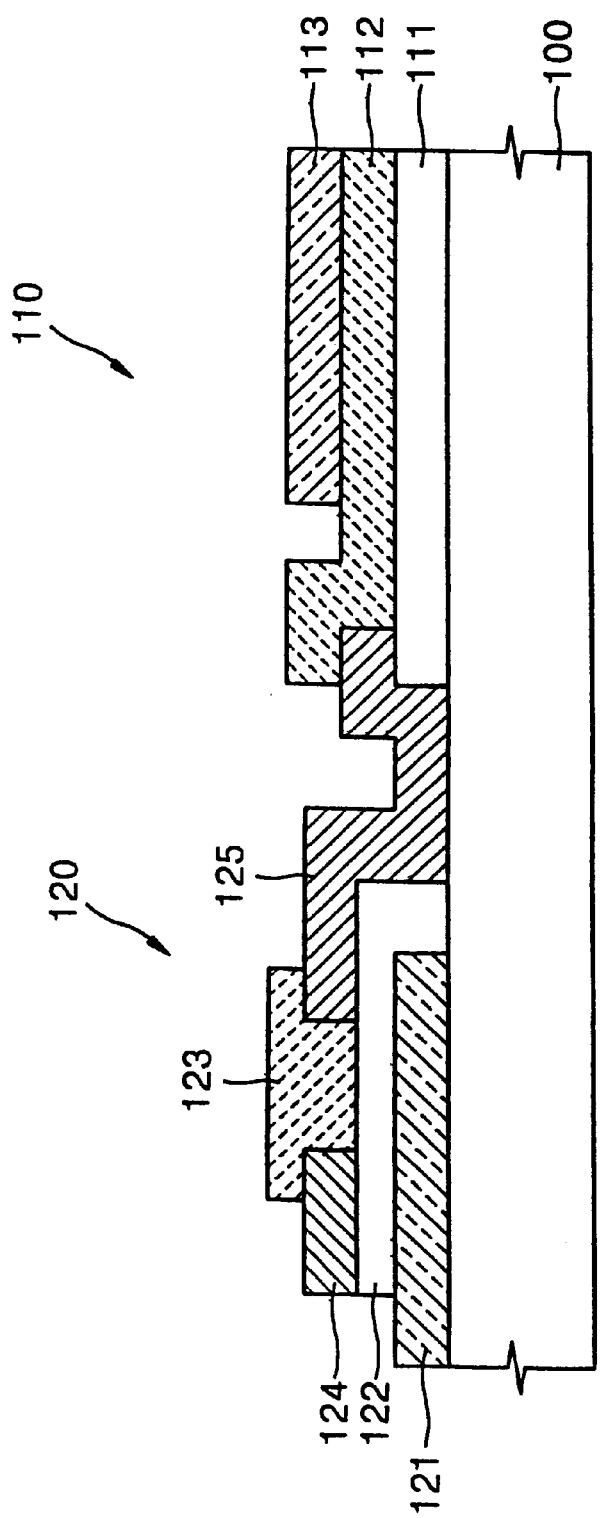
FIG. 1 is a cross-sectional view showing an example of a conventional organic electroluminescent (EL) device having an organic FET and an organic LED incorporated therein.
Figure 2:
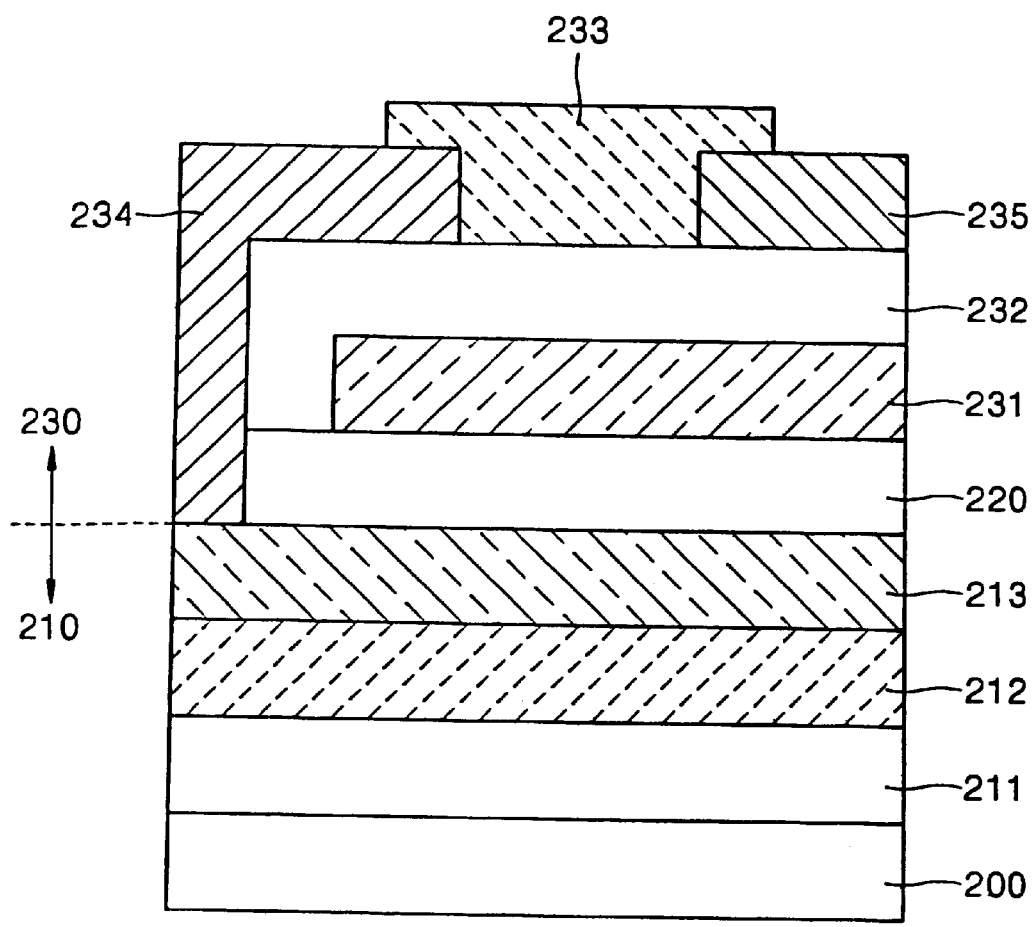
FIG. 2 is a cross-sectional view of an organic EL device having an organic FET and an organic LED incorporated therein according to an embodiment of the present invention.

FIG. 2 is a cross-sectional view of an organic EL device having an organic FET and an organic LED incorporated therein according to an embodiment of the present invention.

Referring to FIG. 2, the organic EL device according to the present invention includes an organic LED 210 and an organic FET 230 for driving the organic LED 210. The organic FET 230 and the organic LED 210 are vertically arranged on a substrate 200. Here, the substrate 200 may be a plastic or glass substrate. Also, a crystalline substrate may be used as the substrate 200.

The organic LED 210 includes a transparent electrode 211, an organic light-emitting layer 212 and a metal electrode 213. In other words, the organic LED 210 includes the transparent electrode 211, the organic light-emitting layer 212 and the metal electrode 213 sequentially arranged over the substrate 200.

The transparent electrode 211 is used as an anode for hole injection and is formed of a transparent metal oxide having a high work function and capable of transmitting emitted light outside the device. Examples of the transparent metal oxide include indium tin oxide (ITO), indium zinc oxide (IZO) and aluminum zinc oxide (AZO).

The organic light-emitting layer 212 includes an organic monomolecular component or an organic polymeric component. Representative examples of the organic monomolecular component include blue light emitting monomolecular components such as anthracene or phenyl-substituted cyclopentadiene derivattves, green light emitting monomolecular components such as tris(8-hydroxyquinolinato) aluminum (hereinafter referred to as $Alq_3$), and yellow light emitting monomolecular components for emitting yellow light having a wavelength of 580 nm, such as 1,2-phthaloperinon. In addition, light having various colors can be emitted by doping predetermined organic pigments into such organic monomolecular components. If the organic light-emitting layer 212 is formed of such an organic monomolecular component, it is driven at a low voltage and exhibits a relatively high luminance. Representative examples of the organic polymericcomponent include PT(polythiophene) and its derivatives, PPV (poly(p-phenylene vinylene)) and its derivatives, PPP (poly(p-phenylene)) and its derivatives.

The metal electrode 213 is used as a cathode electrode for electron injection and is formed of a metal having a small work function. For example, the metal electrode 213 includes at least one selected from the group consisting of aluminum (Al), magnesium (Mg), calcium (Ca), barium (Ba), lithium (Li), yttrium (Y), ytterbium (Yb), cesium (Cs) and silver (Ag).

The organic FET 230 includes first and second insulating layers 220 and 232, a gate electrode 231, an organic semiconducting layer 233, a source electrode 234 and a drain electrode 235.

The first insulating layer 220 is interposed between the metal electrode 213 and the gate electrode 231 and electrically insulates the metal electrode 213 of the organic LED 210 from the gate electrode 220 of the organic FET 230. A material having a relatively smaller dielectric constant is used as the first insulating layer 220 to reduce an additional storage capacity. Also, a material having a high breakdown voltage is used as the first insulating layer 220. The first insulating layer 220 may include both an organic material and an inorganic material.

The second insulating layer 232 formed on and over the gate electrode 231 and the first insulating layer 220, suppresses direct connection between the source electrode 234 and the drain electrode 235 and is used as a gate insulator for inducing a high charge density into the organic semiconducting layer 233 by applying a low voltage to the gate electrode 231. The second insulating layer 232 is formed of at least one selected from the group consisting of gold (Ag), palladium (Pd), silver (Ag), platinum (Pt), aluminum (Al), copper (Cu) and titanium (Ti).

The organic semiconducting layer 233 is formed on the second insulating layer 232 and its conductivity type may be either an n-type or a p-type.

The source electrode 234 is in direct contact with the metal electrode 213 of the organic LED 210 through a via hole passing through the first and second insulating layers 220 and 232, and is connected to the organic semiconducting layer 233 on the second insulating layer 232. Likewise, the drain electrode 235 is connected to the organic semiconducting layer 233 on the second insulating layer 232. A channel is formed in the organic semiconducting layer 233 between the source electrode 234 and the drain electrode 235 as a predetermined voltage is applied to the gate electrode 231. The source electrode 234 and the drain electrode 235 include at least one selected from the group consisting of titanium (Ti), gold (Ag), palladium (Pd), chrome (Cr), platinum (Pt), aluminum (Al), calcium (Ca), barium (Ba), magnesium (Mg), silver (Ag), strontium (Sr) and lithium (Li).

Figure 3:
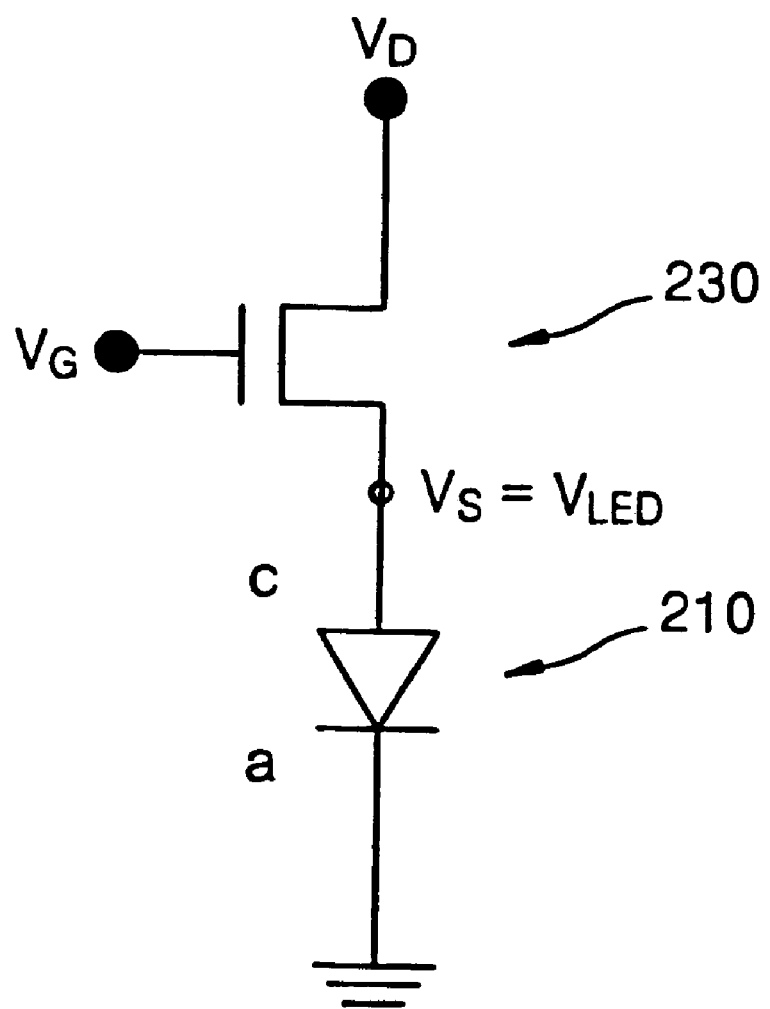
FIG. 3 is an equivalent circuit diagram of an organic EL device shown in FIG. 2.

FIG. 3 is an equivalent circuit diagram of the organic EL device shown in FIG. 2. In FIG. 3, reference symbol "VG" is a voltage applied to the gate electrode 231, reference symbol "VD" is a voltage applied to the drain electrode 235, reference symbol "Vs" is a voltage applied to the source electrode 234, and reference symbol "VLED" is a voltage applied to the metal electrode 213.

Referring to FIG. 3, the organic FET 230 and the organic LED 210 are serially connected to each other. In other words, the source electrode 234 of the organic FET 230 directly contacts the metal electrode 213 of the organic LED 210. Thus, the voltage Vs applied to the source electrode 234 and the voltage VD applied to the metal electrode 213 are equal in magnitude. Carriers are injected from the metal electrode 213 into the organic light-emitting layer 212 of the organic LED 210 as the voltage VLED is applied to the metal electrode 213. The injected carriers move along molecular bonds existing in the organic light-emitting layer 212 to generate excitons. The excitons extinguish while emitting light corresponding to a carrier-lattice energy gap.

Figure 4:
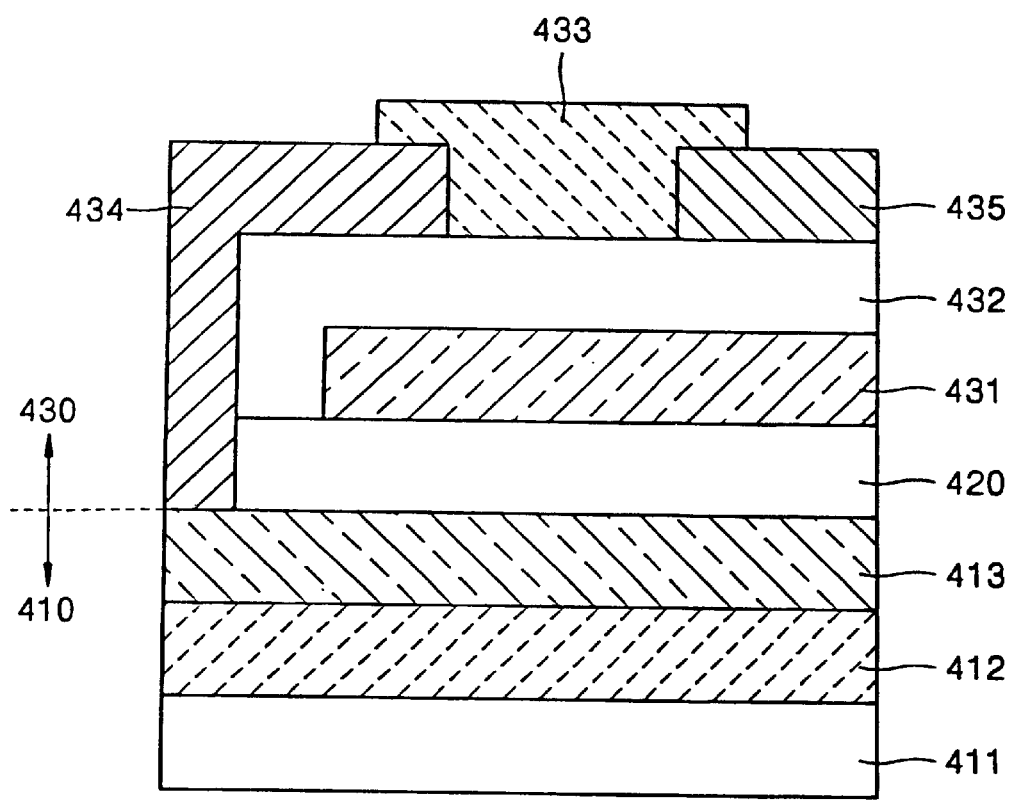
FIG. 4 is a cross-sectional view of an organic EL device having an organic FET and an organic LED incorporated therein according to another embodiment of the present invention.

FIG. 4 is a cross-sectional view of an organic EL device having an organic FET and an organic LED incorporated therein according to another embodiment of the present invention. This embodiment is different from the first embodiment in that a metal substrate serving as a cathode of the organic LED is used, rather than a separate substrate.

Referring to FIG. 4, an organic light-emitting layer 412 and a transparent electrode 411 are sequentially formed on the bottom surface of a metal substrate 413, to form an organic LED 410. A metal having a low work function is used as the metal substrate 413 to be used as a cathode for electron injection. For example, aluminum or stainless steel coated with one selected from the group consisting of Al, Ca, Sr, Y, Yb, Li and Mg, is used as the metal substrate 413.

An organic FET 430 for driving the organic LED 410 is formed over the metal substrate 413. In more detail, a first insulating layer 420 is formed on the top surface of the metal substrate 413, that is, on the bottom surface of the metal substrate 413, which is opposite to the surface on which the organic LED 410 is formed. A gate electrode 431 is formed on the first insulating layer 420. A second insulating layer 432 is formed on the gate electrode 431. The second insulating layer 432 is disposed to completely cover the gate electrode 431, and the first and second insulating layers 420 and 432 have a via hole partially exposing the surface of the metal substrate 413. An organic semiconducting layer 433 is formed on the second insulating layer 432. A source electrode 434 is connected to one end of the organic semiconducting layer 433 on the second insulating layer 432 and is connected to the exposed surface of the metal substrate 413 through the via hole. A drain electrode 435 is connected to the other end of the organic semiconducting layer 433 on the second insulating layer 432.

Figure 5:
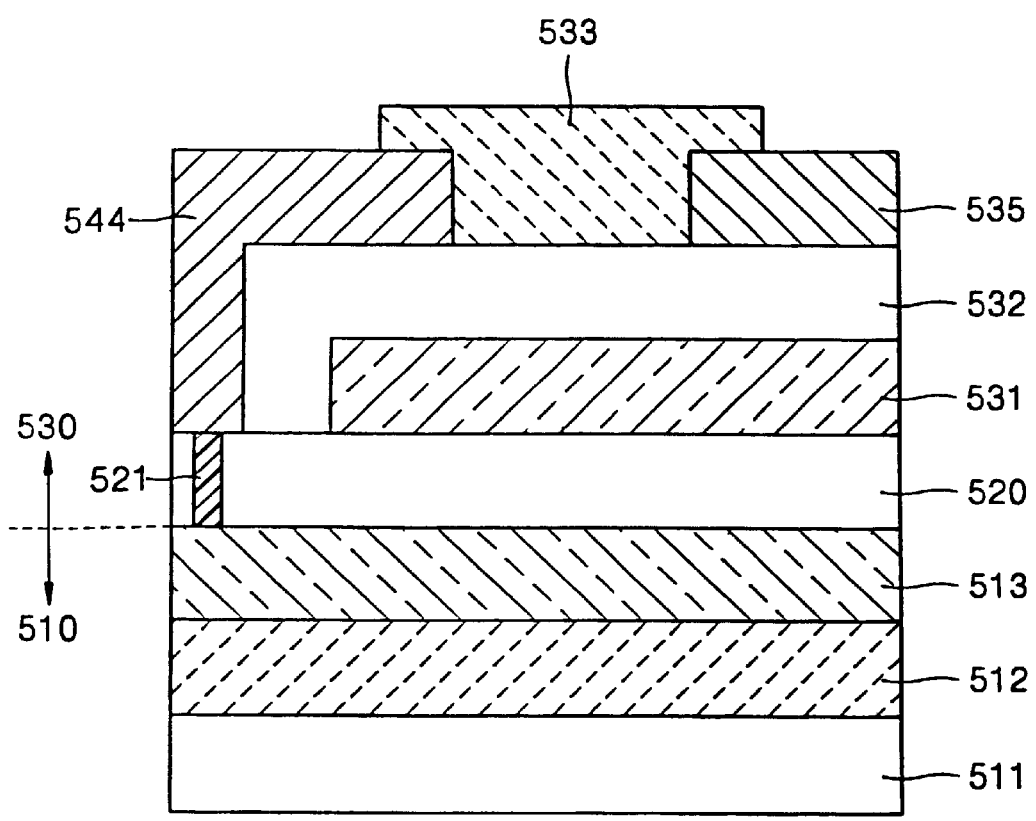
FIG. 5 is a cross-sectional view of an organic EL device having an organic FET and an organic LED incorporated therein according to another embodiment of the present invention.

FIG. 5 is a cross-sectional view of an organic EL device having an organic FET and an organic LED incorporated therein according to another embodiment of the present invention. This embodiment is different from the first and second embodiments in that an insulating substrate for electrically isolating a metal electrode of the organic LED from a gate electrode of the organic FET, is used as a substrate.

Referring to FIG. 5, an organic LED 510 is disposed on the bottom surface of an insulating substrate 520 having a via contact layer 521, and an organic FET 530 is disposed on the top surface of the insulating substrate 520. A glass or plastic substrate may be used as the insulating substrate 520. The via contact layer 521 may be formed of a metal or another material having a good conductivity. The organic LED 510 formed on the bottom surface of the insulating substrate 520 is constructed such that a metal electrode 513, an organic light-emitting layer 512 and a transparent electrode 511 are sequentially stacked. The metal electrode 513 is used as a cathode electrode for electron injection and is formed of a metal having a small work function. For example, the metal electrode 213 includes at least one selected from the group consisting of aluminum (Al), calcium (Ca), barium (Ba), yttrium (Y), ytterbium (Yb), lithium (Li) and magnesium (Mg). The organic light-emitting layer 512 212 includes an organic monomolecular component or an organic polymeric component. The transparent electrode 511 can be formed of indium tin oxide (ITO), indium zinc oxide (IZO) or aluminum zinc oxide (AZO). Also, the transparent electrode 511 may be formed by forming a thin film of Au, Pt or Ag having a thickness of 50 μm or less and then depositing the metal oxide thereon.

The organic FET 530 for driving the organic LED 510 is formed over the insulating substrate 520. In more detail, a gate electrode 531 is formed on the top surface of the insulating substrate 520, that is, on the surface opposite to the surface on which the organic LED 510 is formed. An insulating layer 532 as a gate insulating layer is formed on the gate electrode 531. Here, the insulating layer 532 is disposed to completely cover the gate electrode 531 and exposes the via contact layer 521 of the insulating substrate 520. An organic semiconducting layer 533 is formed on the insulating layer 532. A source electrode 534 is connected to one end of the organic semiconducting layer 533 on the insulating layer 532 and is connected to the exposed surface of the metal substrate 513 of the organic LED 510 through the via contact layer 521. A drain electrode 535 is connected to the other end of the organic semiconducting layer 533 on the insulating layer 532.

Now, a method for fabricating an organic EL device according to the present invention will be described.

First, referring back to FIG. 2 showing a first embodiment of the present invention, the transparent electrode 211, the organic light-emitting layer 212 and the metal electrode 213 are sequentially arranged over the substrate 200, thereby forming the organic LED 210.

The substrate 200 may be formed of plastic or glass. A crystalline substrate may also be used as the substrate 200. The transparent electrode 211 is used as an anode for hole injection and is formed of a transparent metal oxide having a high work function and capable of transmitting emitted light outside the device. Examples of the transparent metal oxide include indium tin oxide (ITO), indium zinc oxide (IZO) and aluminum zinc oxide (AZO), as described above.

The organic light-emitting layer 212 includes an organic monomolecular component or an organic polymeric component and is formed by thermal evaporation, spin coating, pulsed laser deposition, cluster ion beam deposition or sputtering.

The metal electrode 213 is used as a cathode electrode for electron injection and is formed of a metal having a small work function. For example, the metal electrode 213 is formed of at least one selected from the group consisting of aluminum (Al), magnesium (Mg), calcium (Ca), barium (Ba), lithium (Li), yttrium (Y), ytterbium (Yb), cesium (Cs) and silver (Ag). The metal electrode 213 is formed by thermal evaporation, spin coating, pulsed laser deposition, cluster ion beam deposition or sputtering.

Next, the organic FET 230 for driving the organic LED 210 is vertically disposed on the organic LED 210. In other words, a first insulating layer 220 is formed on the metal electrode 213. Next, a patterned gate electrode 231 is formed a portion of the surface of the first insulating layer 220. Then, a second insulating layer 232 is formed on the first insulating layer 220 and the gate electrode 231. A predetermined mask layer pattern, e.g., a photoresist pattern (not shown), is formed on the second insulating layer 232 and an etching process is performed using the photoresist pattern as an etching mask, thereby sequentially removing the exposed portions of the second insulating layer 232 and the first insulating layer 220. The etching process is performed until the via hole partially exposing the surface of the metal electrode 213. A metal electrode layer 234+235 covering the second insulating layer 232 is formed while filling the via hole. The metal electrode layer 234+235 is patterned by performing an etching process using a predetermined etching mask. Then, the source electrode 234 contacting the metal electrode 213 and the drain electrode 235 on the second insulating layer 232, are formed, partially exposing the surface of the second insulating layer 232. The organic semiconducting layer 233 is formed on the second insulating layer 232 between the source electrode 234 and the drain electrode 235. In some cases, the organic semiconducting layer 233 may be first formed and the source electrode 234 and the drain electrode 235 may then be formed.

Next, a method for fabricating an organic EL device according to a second embodiment will be described referring back to FIG. 4. The metal substrate 413 having a first, bottom surface and a second, top surface is provided. The metal substrate 413 is used as a cathode of the organic LED 410, and is formed of aluminum or stainless steel coated with one selected from the group consisting of Al, Ca, Sr, Y, Yb, Li and Mg, having a low work function, rather than a glass, plastic or crystalline substrate.

The organic light-emitting layer 412 and the transparent electrode 411 are sequentially formed on the first surface of the metal substrate 413, thereby completing the organic LED 410. The transparent electrode 411 may be formed by directly depositing metal oxide such as indium tin oxide (ITO), indium zinc oxide (IZO) or aluminum zinc oxide (AZO). Alternatively, the transparent electrode 411 may be formed by forming a thin film of Au, Pt or Ag having a thickness of 50 µm or less and then depositing the metal oxide thereon.

Next, the first insulating layer 420 is formed on the second surface of the metal substrate 413 and the organic FET 430 for driving the organic LED 410 is vertically disposed on the organic LED 410. In detail, in order to form the organic FET 430, the patterned gate electrode 431 is formed on the first insulating layer 420. The second insulating layer 432 is formed on the first insulating layer 420 and the gate electrode 431. A predetermined mask layer pattern, e.g., a photoresist pattern (not shown), is formed on the second insulating layer 432 and then an etching process is performed using the photoresist pattern as an etching mask, thereby sequentially removing the exposed portions of the second insulating layer 432 and the first insulating layer 420. The etching process is performed until the via hole partially exposing the surface of the metal electrode 413. A metal electrode layer 434+435 covering the second insulating layer 432 is formed while filling the via hole. The metal electrode layer 434+435 is patterned by performing an etching process using a predetermined etching mask. Then, the source electrode 434 contacting the metal electrode 413 and the drain electrode 435 on the second insulating layer 432, are formed. The organic semiconducting layer 433 is formed on the second insulating layer 432 between the source electrode 434 and the drain electrode 435. In some cases, the organic semiconducting layer 433 may be first formed and the source electrode 434 and the drain electrode 435 may then be formed.

Next, a method for fabricating an organic EL device according to a third embodiment will be described referring back to FIG. 5. The insulating substrate 520 having the first, bottom surface and the second, top surface, and having the via contact layer 521, is provided. The insulating substrate 520 may be a glass or plastic substrate having the via contact layer 521 filled with a conductive material. The organic LED 510 is formed on the first surface of the insulating substrate 520 and the organic FET 530 is formed on the second surface thereof, so that the organic LED 510 and the organic FET 530 are vertically disposed.

In order to form the organic LED 510, the metal electrode 513, the organic light-emitting layer 512 and the transparent electrode 511 are sequentially stacked.

In order to form the organic FET 530, the patterned gate electrode 531 is formed on a portion of the surface of the first insulating layer 520 so as not to cover the via contact layer 521. Next, the insulating layer 532 is formed on the insulating substrate 520 and the gate electrode 531. Then, the insulating layer 532 is patterned to expose the via contact layer 521 and then a metal electrode layer 544+545 contacting the via contact layer 521 and covering the insulating layer 532 is formed. The metal electrode layer 544+545 is patterned to partially expose the surface of the insulating layer 532. Then, the source electrode 534 contacting the metal electrode 513 and the drain electrode 535 on the insulating layer 532, are formed. The organic semiconducting layer 533 is formed on the insulating layer 532 between the source electrode 544 and the drain electrode 545.

According to the organic EL device and its fabrication method of the present invention, since an organic LED and an organic FET for driving the organic LED are vertically incorporated, the aperture ratio can be greatly increased and the luminous area can be reduced, thereby increasing the life cycle of the device.

What is claimed is:

1. A method for fabricating an organic EL device comprising the steps of:

sequentially forming a transparent electrode, an organic light-emitting layer and a metal electrode over a substrate to form an organic LED;

forming a first insulating layer on the metal electrode;

forming a gate electrode patterned on a portion of the surface of the first insulating layer;

forming a second insulating layer on the first insulating layer and the gate electrode;

sequentially patterning the second insulating layer and the first insulating layer to form a via hole partially exposing the surface of the metal electrode;

forming a metal electrode layer filling the via hole and covering the second insulating layer;

patterning the metal electrode layer to partially expose the surface of the second insulating layer, and forming a source electrode contacting the metal electrode and a drain on the second insulating layer; and forming an organic semiconducting layer on the second insulating layer between the source electrode and the drain electrode.

2. The method according to claim 1, wherein the organic light-emitting layer is formed of an organic monomolecular material or an organic polymeric material.

3. The method according to claim 2, wherein the organic light-emitting layer is formed by thermal evaporation, spin coating, pulsed laser deposition, cluster ion beam deposition or sputtering.

4. The method according to claim 1, wherein the metal electrode is formed by thermal evaporation, spin coating, pulsed laser deposition, cluster ion beam deposition or sputtering.

5. A method for fabricating an organic EL device comprising the steps of:

providing a metal substrate having a first, bottom surface and a second, top surface;

sequentially forming an organic light-emitting layer and a transparent electrode on the first surface of the metal substrate;

forming a first insulating layer on the second surface of the metal substrate;

forming a gate electrode patterned on a portion of the surface of the first insulating layer;

forming a second insulating layer on the first insulating layer and the gate electrode;

sequentially patterning the second insulating layer and the first insulating layer to form a via hole partially exposing the surface of the metal substrate;

forming a metal electrode layer filling the via hole and covering the second insulating layer;

patterning the metal electrode layer to partially expose the surface of the second insulating layer, and forming a source electrode contacting the metal electrode and a drain on the second insulating layer; and forming an organic semiconducting layer on the second insulating layer between the source electrode and the drain electrode.

6. The method according to claim 5, wherein in step of providing the metal substrate, aluminum or stainless steel coated with one selected from the group consisting of Al, Ca, Sr, Y, Yb, Li and Mg, is used.

7. A method for fabricating an organic EL device comprising the steps of:

providing an insulating layer having a first, bottom surface and a second, top surface;

sequentially forming a metal electrode, an organic light-emitting layer and a transparent electrode on the first surface of the insulating substrate;

forming a gate electrode patterned on a portion of the surface of the insulating layer so as not to cover the via hole;

forming an insulating layer on the insulating substrate and the gate electrode;

patterning the second insulating layer to expose the via hole of the insulating substrate;

forming a metal electrode layer contacting the via hole and covering the insulating layer;

patterning the metal electrode layer to partially expose the surface of the insulating layer, and forming a source electrode contacting the metal electrode and a drain on the second insulating layer; and forming an organic semiconducting layer on the insulating layer between the source electrode and the drain electrode.

8. The method according to claim 7, wherein in the step of providing the insulating layer, a glass or plastic substrate having a via hole is used.

* * * * *

UNITED STATES PATENT AND TRADEMARK OFFICE
CERTIFICATE OF CORRECTION

PATENT NO.   : 6,524,884 B1  
DATED        : February 25, 2003  
INVENTOR(S)  : Kim et al.

Page 1 of 1

It is certified that error appears in the above-identified patent and that said Letters Patent is hereby corrected as shown below:

Title page,
Item [56], References Cited, FOREIGN PATENT DOUMENTS, please delete "5/1998" and insert -- 12/1998 --; and please delete "H01S/3/00" and insert -- H01S3/00 --; and please delete "H01L/29/786" and insert -- H01L29/786 --.

Column 11,
Lines 7 and 14, please delete "layer" and insert -- substrate --.
Line 12, please delete "substrate;" and insert -- substrate; forming a via hole in the insulating substrate thereby exposing the metal electrode; --.

Column 12,
Line 1, please delete "second insulating" and insert -- insulating --.

Signed and Sealed this

Fourteenth Day of December, 2004

JON W. DUDAS
*Director of the United States Patent and Trademark Office*